(12) United States Patent
McIntyre et al.

(10) Patent No.: US 8,374,039 B2
(45) Date of Patent: Feb. 12, 2013

(54) MULTI-PORT MEMORY ARRAY

(75) Inventors: David Hugh McIntyre, Sunnyvale, CA (US); Jimmy L. Reaves, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 182 days.

(21) Appl. No.: 12/975,718

(22) Filed: Dec. 22, 2010

(65) Prior Publication Data

US 2012/0163102 A1 Jun. 28, 2012

(51) Int. Cl.
*G11C 7/06* (2006.01)
(52) U.S. Cl. ......... 365/189.07; 365/230.03; 365/230.05; 365/230.01
(58) Field of Classification Search ............. 365/189.07, 365/230.03, 230.05, 230; 712/205
See application file for complete search history.

(56) References Cited

U.S. PATENT DOCUMENTS

| 7,586,341 | B2 * | 9/2009 | Wang et al. | 327/108 |
| 8,151,091 | B2 * | 4/2012 | Chang et al. | 712/209 |
| 2009/0296698 | A1 * | 12/2009 | Sutou et al. | 370/382 |
| 2012/0057411 | A1 * | 3/2012 | Koeppe et al. | 365/189.02 |

* cited by examiner

*Primary Examiner* — Fernando Hidalgo
(74) *Attorney, Agent, or Firm* — Volpe and Koenig, P.C.

(57) ABSTRACT

A multi-port memory array is disclosed. The memory array includes a plurality of memory subblocks and an output network. Each memory subblock includes a plurality of single-read-port memory cells. The output network is configured to redirect information read for a first read port to a second read port on a condition that an equivalence signal indicates that read addresses for the first read port and the second read port are the same. The latching and multiplexing operation may be integrated. The memory cells may be 6-transistor synchronous random access memory (SRAM) cells, 8-transistor SRAM cells, or any type of memory cells.

20 Claims, 10 Drawing Sheets

MULTI-PORT MEMORY ARRAY

FIELD OF THE INVENTION

This application is related to a multi-port memory array implemented with single-read-port memory elements.

BACKGROUND

Dual-port memory arrays offer a higher data throughput compared to single-port memory arrays since two memory accesses may be performed simultaneously in a single clock cycle. However, dual-port memory array cells require more transistors per cell than single-port memory cells.

In order to reduce the area and cost, a dual read-port memory array has been implemented with single-read-port memory elements. Such memory arrays are more area, power, and timing efficient than a memory array implemented with dual-read-port memory elements.

FIG. 1 shows a conventional banked memory (static random access memory (SRAM)) with two read-ports and one write-port implemented with 6-transistor (6T) SRAM cells. The memory array is divided into a plurality of memory banks. In this case, two memory requests may access different banks simultaneously, but not the same memory bank.

FIG. 2 shows another conventional banked memory (SRAM) with two read-ports and one write-port implemented with 8 transistor (8T) SRAM cells. In this case, a write request may be processed separately from the read requests, but two read requests may not access the same memory bank simultaneously. The difference from the 6T case is that the write port is independent and does not cause conflicts with reads.

In a dual-read-port memory array implemented with single-read-port memory elements, certain resources within the memory array have to be shared between ports. If the two memory requests attempt to access the shared resource, a conflict occurs and the conflict is resolved by granting a shared-resource access to one of the requestors, (e.g., the first port is given priority and the second port waits or fails). This arbitration process must occur as quickly as possible so as not to negatively impact the timing performance of the storage array.

SUMMARY OF EMBODIMENTS

A multi-read-port memory array is disclosed. The memory array includes a plurality of memory subblocks and an output network. Each memory subblock includes a plurality of single-read-port memory cells. The output network is configured to redirect information read for a first read port to a second read port on a condition that an equivalence signal indicates that read addresses for the first read port and the second read port are the same. The latching and multiplexing operation may be integrated. The memory cells may be 6-transistor SRAM cells, 8-transistor SRAM cells, or any type of memory cells.

BRIEF DESCRIPTION OF THE DRAWINGS

A more detailed understanding may be had from the following description, given by way of example in conjunction with the accompanying drawings wherein.

DETAILED DESCRIPTION OF EMBODIMENTS

Figure 1:
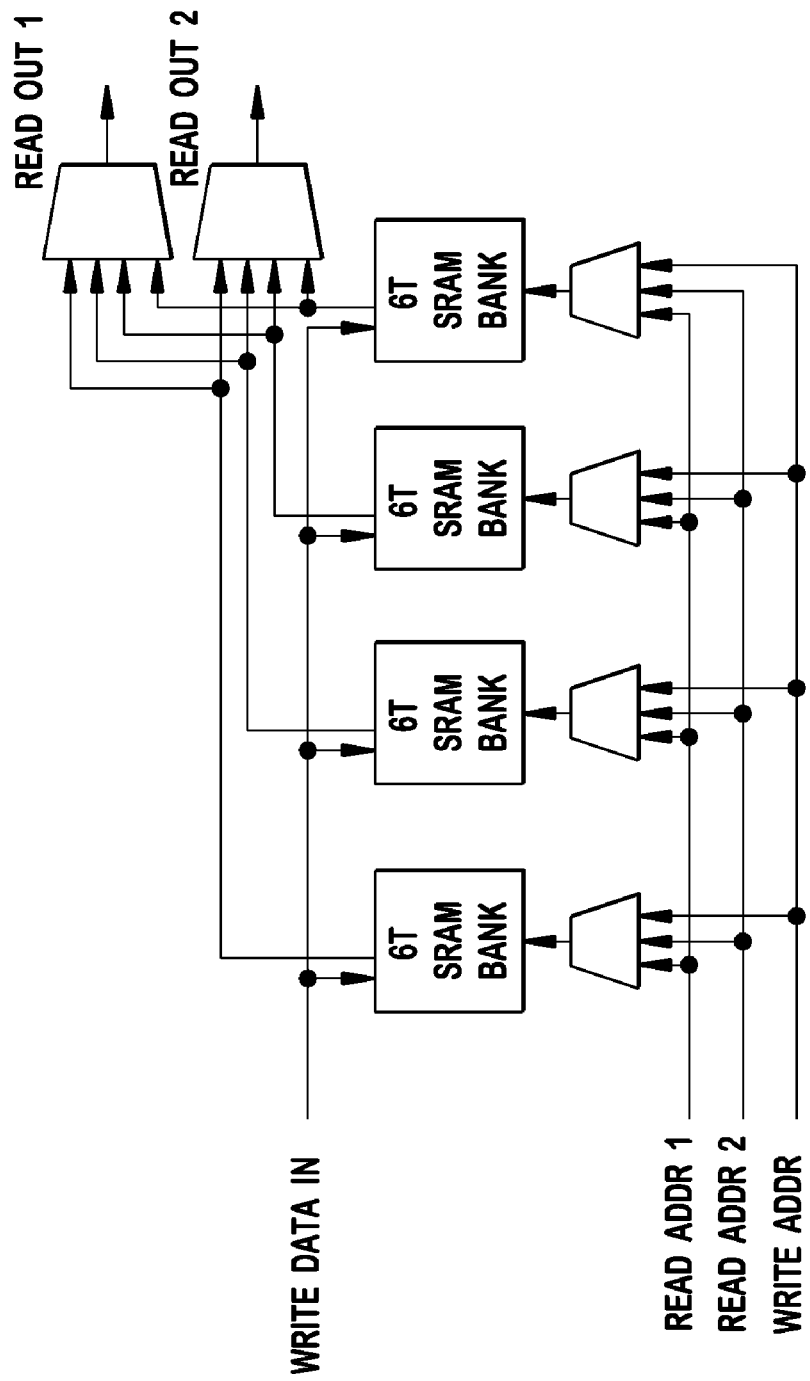
FIG. 1 shows a conventional banked memory (SRAM) with two read-ports and one write-port implemented with 6-transistor SRAM cells.
Figure 2:
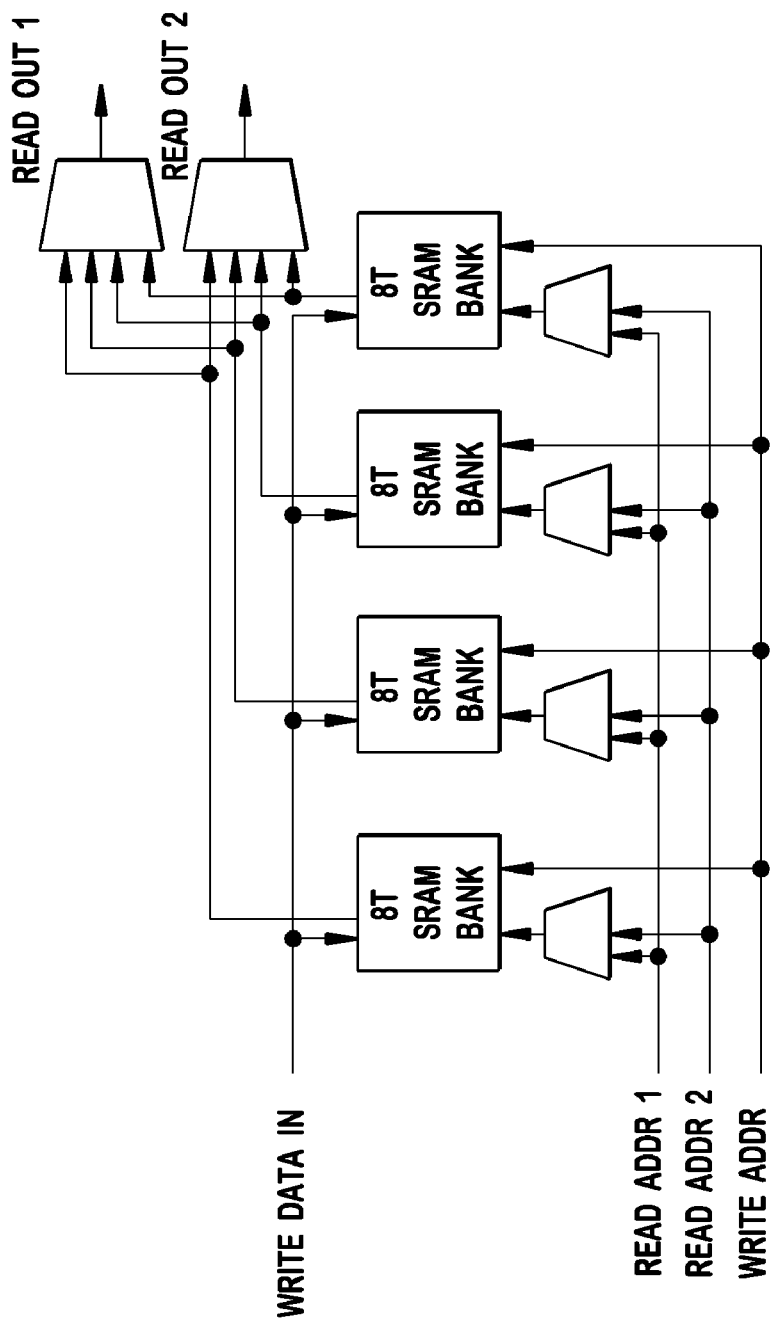
FIG. 2 shows another conventional banked memory with two read-ports and one write-port implemented with 8 transistor SRAM cells.

The embodiments will be described with reference to the drawing figures wherein like numerals represent like elements throughout.

Embodiments disclosed herein may be implemented for any type of memory array, (e.g., cache, etc.), that may be included in a processor, (e.g., central processing units (CPU), graphics processing units (GPU), or the like), or any chipset or integrated circuit.

A multi-port memory array is built with single-read-port memory cells. The single-read-port memory cells may be memory cells having a shared read-write port, one read port and one write port, or one read port and multiple write ports. The memory array in any embodiments disclosed herein may be implemented with 8T SRAM cells, 6T SRAM cells, or any other types of memory cells. It should also be noted that the embodiments will be explained with reference to a two-read-port memory array, but the embodiments may be applied to multi-port memory arrays with any number of read ports and/or write ports.

In a conventional multi-read-port memory array, if two or more read requests access the same memory subblock, a conflict occurs. In a multi-read-port array in accordance with embodiments disclosed herein, if two or more read requests access the same memory subblock, but the read requests are to the same memory location, all read requests may be satisfied from the same memory subblock access while avoiding the conflict.

Figure 3:
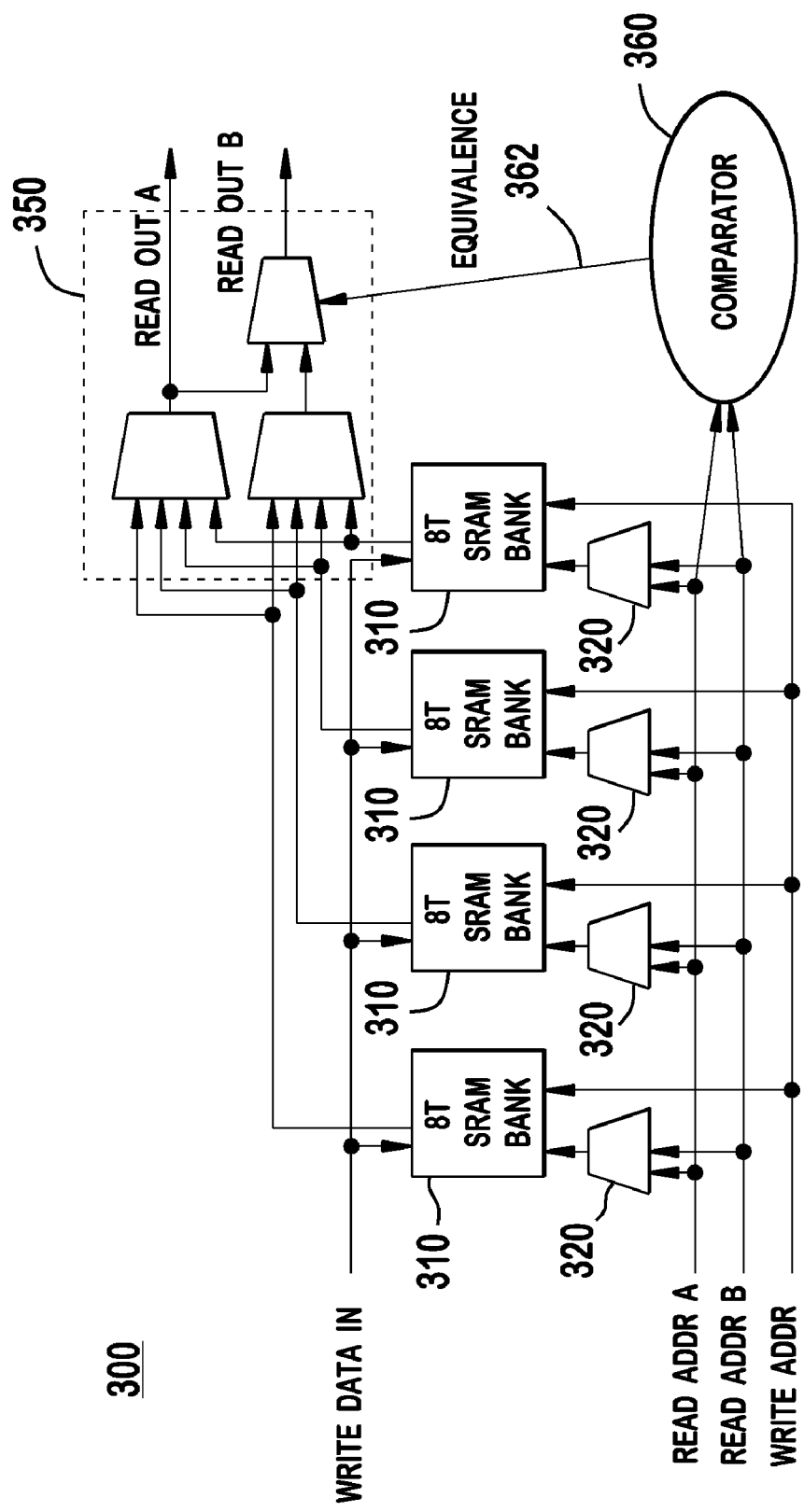
FIG. 3 is a schematic diagram of an example dual read-port memory array implemented with single-port memory cells in accordance with one embodiment

FIG. 3 is a schematic diagram of an example dual read-port memory array 300 implemented with single-read-port memory cells in accordance with one embodiment. The memory array 300 may comprise a plurality of memory subblocks 310 and an output network 350. Each memory subblock 310 comprises a plurality of memory cells. The output network 350 samples the information read from the memory cells and outputs it onto the corresponding read ports. The output network 350 is also configured to redirect the information read for a first read port to a second read port on a condition that an equivalence signal indicates that the read addresses for the first read port and the second read port are the same. The output network 350 may include a multiplexer and/or a latch, or the like for sampling and/or redirecting the information, which will be explained in detail below.

The memory array 300 may include a comparator 360 that compares the two read addresses and issues the equivalence signal 362 to the output network 350. If the two read addresses are the same, the output network 350 redirects the output on port A onto port B. The read address comparison is performed in parallel with the memory array read operations, and is therefore removed from the critical access path, improving array performance.

The memory array 300 may include a plurality of memory banks arranged in one or more than one hierarchical level. Alternatively, the memory array 300 may include a single memory bank that is subdivided into a plurality of micro-banks in one or more than one hierarchical level. The embodiments disclosed herein may be implemented in the memory bank or micro-bank in any hierarchical level such that information read for one read port is redirected to another read port on a condition that the equivalence signal indicates that the read addresses for the read ports are the same.

The multiple read addresses are multiplexed by the multiplexers 320. Two read requests may access different banks simultaneously, but not the same memory bank. If the two read addresses are directed to the same memory subblock, a conflict occurs and one of them may be suppressed. The conflict may be resolved by any conventional conflict-resolution schemes, (e.g., a first port takes priority, a round-robin priority, etc.). If there is a conflict, the information read from the array from one of the ports, (e.g., the high-priority port, say port A), is valid, but the information on the other port, (e.g., the low-priority port, say port B), is not. If no conflict occurs, information read from both ports will be valid.

In order to reduce the conflict problem, the granularity of fundamental resource units, (e.g., the memory banks or micro-banks), of the memory array may be increased such that the probability of two ports using the same fundamental resource unit may be kept acceptably low.

Figure 4A:
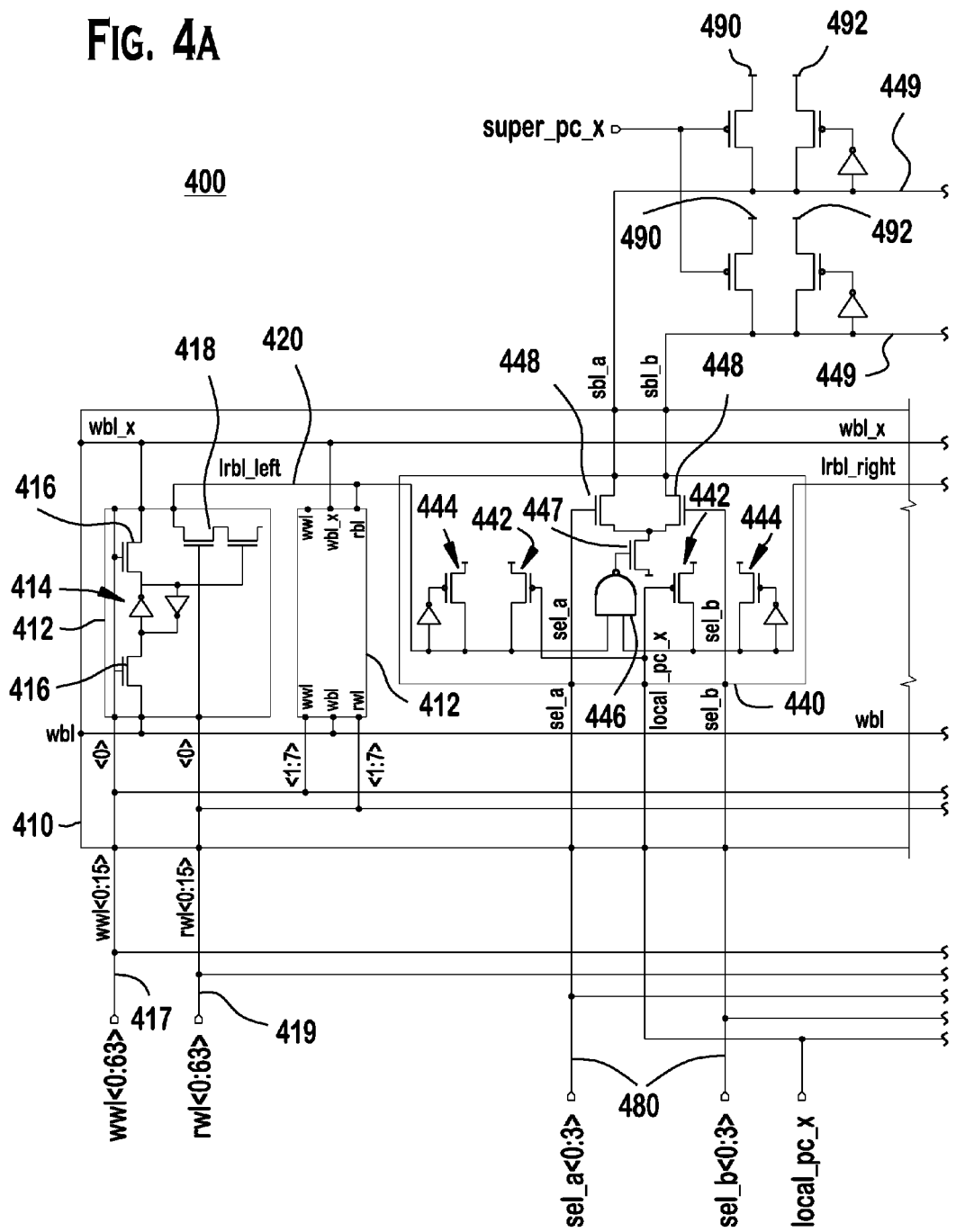
FIG. 4 is a detailed example circuit diagram of the memory array in accordance with one embodiment.
Figure 4B:
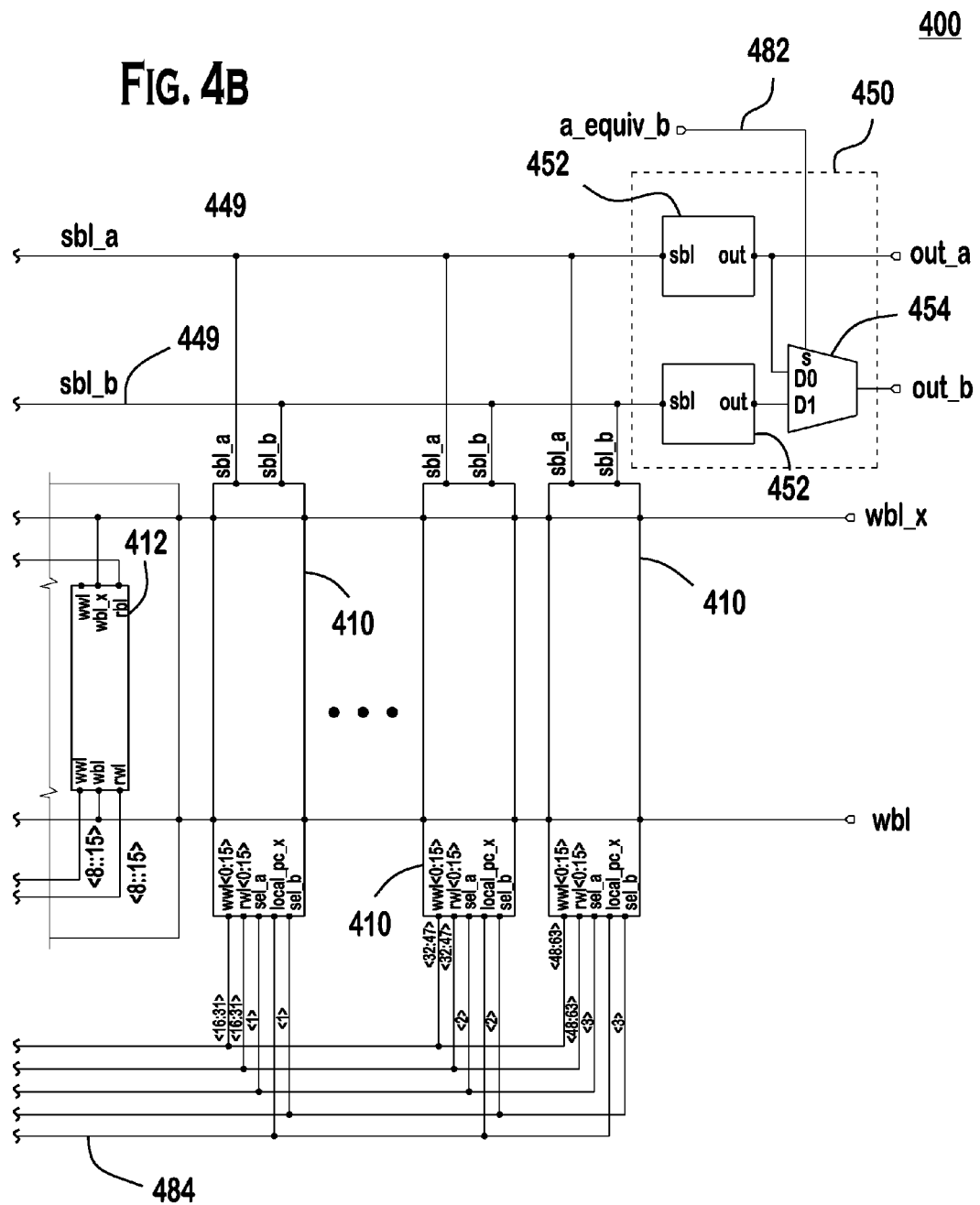

FIG. 4 is a detailed example circuit diagram of a multi-port memory array 400 in accordance with one embodiment. The memory array 400 may comprise a plurality of memory subblocks 410 and an output network 450. Each memory subblock 410 includes a plurality of memory cells 412 and an evaluate circuit 440. It should be noted that the number of memory subblocks in the memory array and the size of each memory subblock may be configured in any configurable way.

The memory cell 412, (which is an 8T cell in this example), includes cross-coupled inverters 414 and transistors 416, 418. Transistors 416 are activated by the write word line 417 for writing operations, and a transistor 418 is activated by the read word line 419 for reading operations. The information stored in the memory cell 412 selected by the activated read word line 419 is transferred onto the local read bit line 420 (either lrbl_left or lrbl_right). Since one of the two read access requests directed to the same memory subblock 410 is suppressed, one read word line 419 will be activated in one memory subblock 410 at any given time, (one of 16 word lines of the memory subblock in this example), and one information bit will be transferred onto the local read bit line 420 (either lrbl_left or lrbl_right) in a memory subblock 410.

The evaluate circuit 440 may include a pre-charge circuit 442, a keeper circuit 444, a NAND gate 446, and gate transistors 448. The local read bit lines 420 (lrbl_left or lrbl_right) are connected to the two inputs of the NAND gate 446, respectively. The local read bit lines 420 are pre-charged by the pre-charge circuit 442 and the keeper circuit 444. The pre-charge circuit 442 is controlled by the pre-charge signal 484. It should be noted that the pre-charge circuit 442 and the keeper circuit 444 shown in FIG. 4 are provided as an example, and any other configuration may be employed.

As the read word line 419 drives the transistor 418, the information stored in a memory cell 412 is captured by the NAND gate 446 and transferred onto one of the super bit lines 449 based on the bank select signal 480, and sampled by the output network 350. The gate transistors 448 are controlled by the bank select signals 480, respectively, such that the information is transferred onto one of the super bit lines 449 (SBL_A and SBL_B) for the corresponding output port.

The output network 450 may include latching or buffering circuits 452 and a multiplexer 454. The latching/buffering circuits 452 for ports A and B sample the signal on the corresponding super bit lines SBL_A and SBL_B, respectively. The multiplexer 452 is connected to the outputs of the latching/buffering circuits 452 and outputs either the port A signal or port B signal onto port B based on the equivalence signal 482, which is generated by comparing the two read addresses. If the two read addresses are not the same, but are directed to the same memory subblock, one memory request is served based on the conflict resolution scheme. If the two read addresses are not the same and are directed to different memory subblocks, the two read accesses will be served simultaneously from the two memory subblocks and the two memory words will be output onto the two output ports A and B, respectively, (i.e., the multiplexer 454 selects the output on the super bit line SBL_B to the output port B). If the two read addresses are the same, one memory word will be read from the memory subblock, (which will be output on port A in this example), and the multiplexer 454 multiplexes the output on the super bit line SBL_A onto output port B.

Some of the benefits of this embodiment are, when the read addresses are the same, power consumption is reduced because SBL_B does not need to discharge, and the NAND gate 446 needs to drive only one of the two super bit lines 449, and the footer device 447 needs to drive through a single gate transistor 448, which allows the footer device 447 to be smaller and use less area.

Figure 5A:
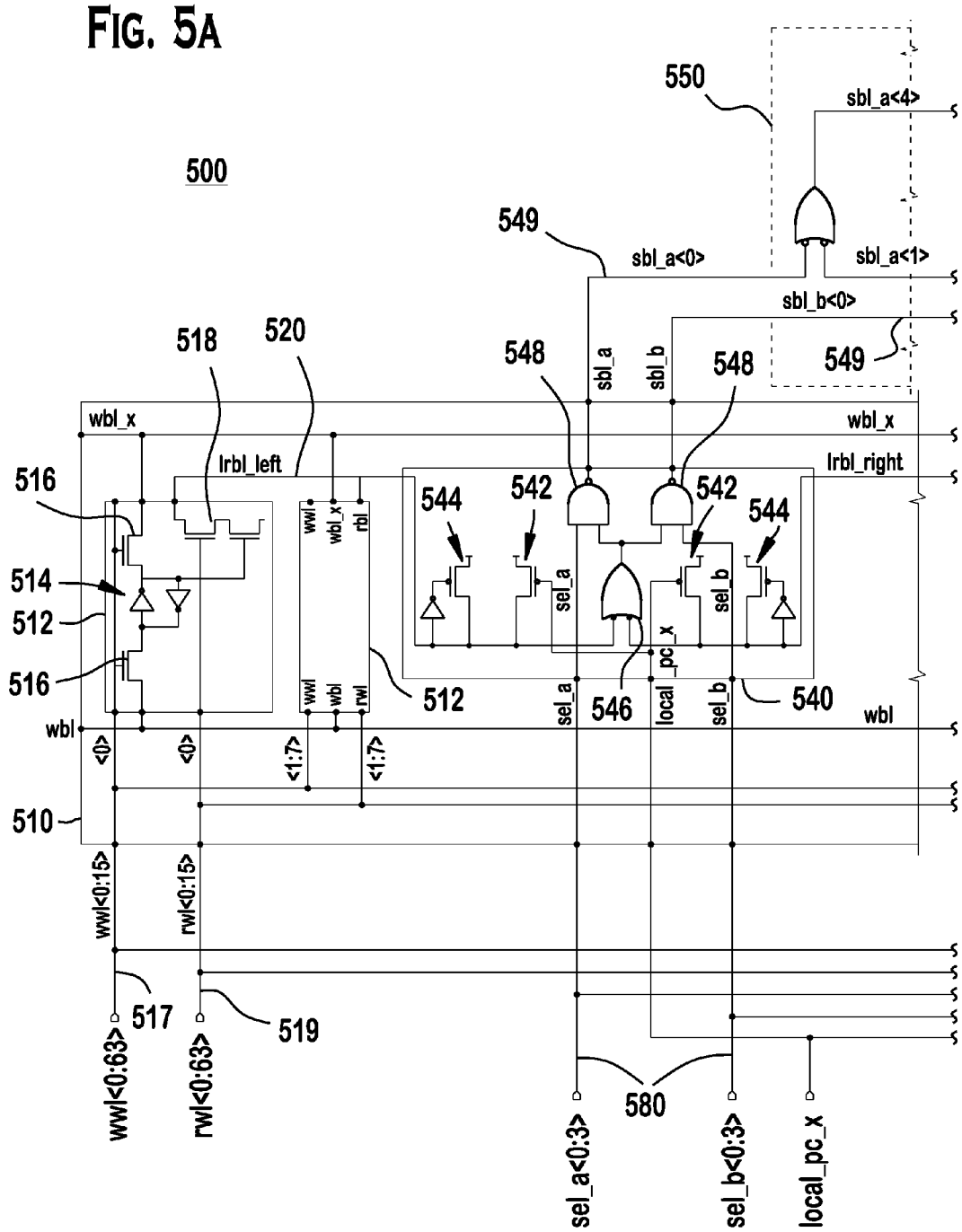
FIG. 5 is a detailed example circuit diagram of the memory array in accordance with another embodiment.
Figure 5B:
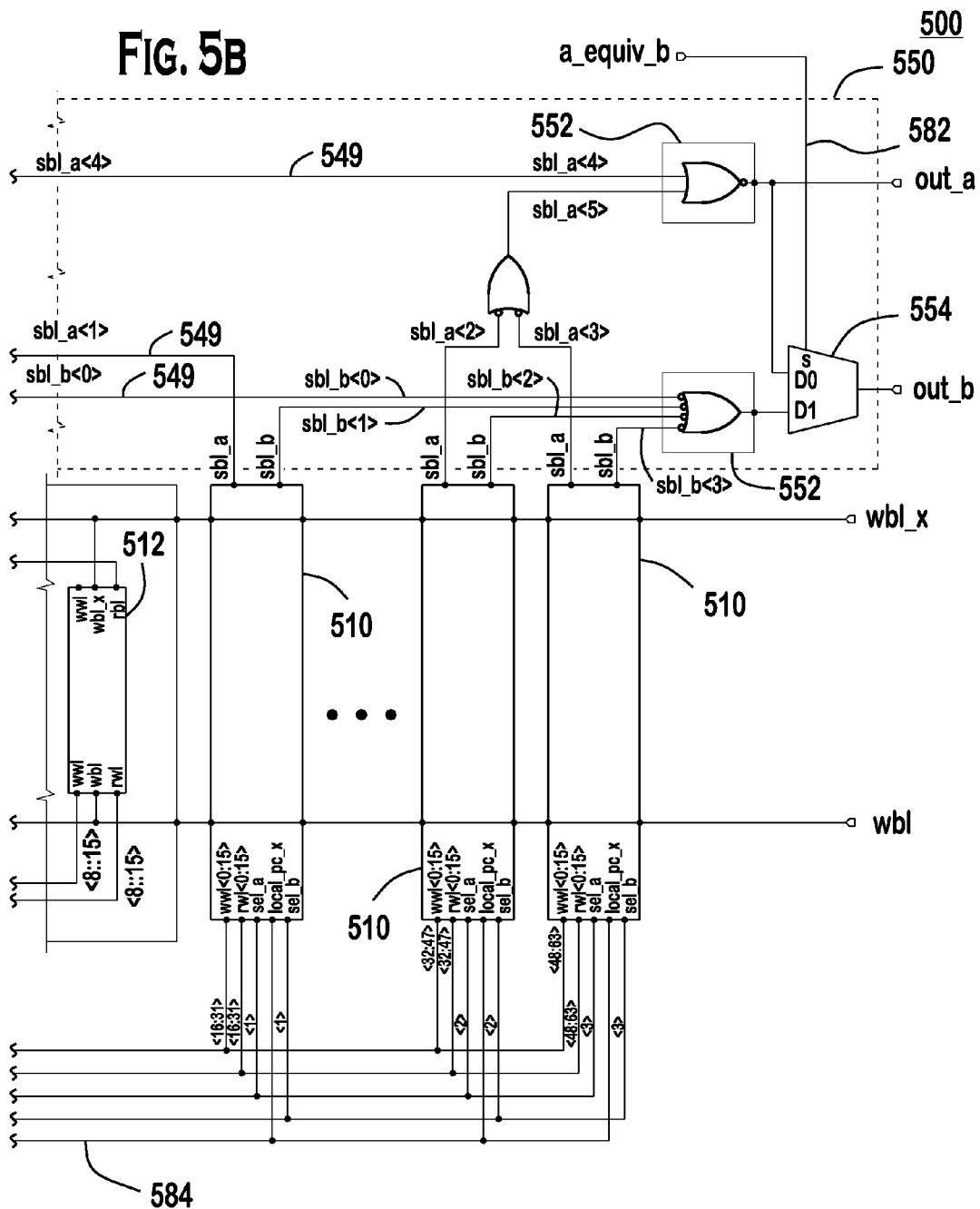

FIG. 5 is an example circuit diagram of the memory array 500 in accordance with another embodiment. The memory array 500 may comprise a plurality of memory subblocks 510 and an output network 550. Each memory subblock 510 includes a plurality of memory cells 512 and an evaluate circuit 540. It should be noted that the number of memory subblocks and the size of each memory subblock may be configured in any configurable way.

The memory cell 512, which is 8T cell in this example, includes cross-coupled inverters 514 and transistors 516, 518. Transistors 516 are activated by the write word line 517 for writing operations, and a transistor 518 is activated by the read word line 519 for reading operations. The information stored in the memory cell 512 selected by the activated read word line 519 is transferred onto the local read bit line 520 (either lrbl_left or lrbl_right). Since one of the two read access requests directed to the same memory subblock 510 is suppressed, one read word line 519 will be activated in one memory subblock 510, (one of 16 word lines of the memory subblock in this example), and one information bit will be transferred onto the local read bit line 520 (either lrbl_left or lrbl_right) in one memory subblock 510.

The evaluate circuit 540 includes a pre-charge circuit 542, a keeper circuit 544, a negative-OR gate 546 (which is equivalent to NAND gate), and NAND gates 548. The local read bit lines 520 (lrbl_left or lrbl_right) are connected to the two inputs of the negative-OR gate 546, respectively. The local read bit lines 520 are pre-charged by the pre-charge circuit 542 and the keeper circuit 544. The pre-charge circuit 542 is controlled by the pre-charge signal 584. It should be noted that the pre-charge circuit 542 and the keeper circuit 544 shown in FIG. 5 are provided as an example, and any other configuration may be employed.

As the read word line 519 drives the transistor 518, the information stored in a memory cell 512 is captured by the negate-OR (NAND) gate 546 and transferred onto one of the super bit lines 549 via one of the NAND gates 548 depending on the bank select signal 580, and sampled by the output network 550. The NAND gates 548 are controlled by the bank select signals 580, respectively, such that the information stored in the memory cell 512 is transferred onto one of the super bit lines 549 (SBL_A and SBL_B) for the corresponding output port.

The output network 550 may include latching or buffering circuits 552 and a multiplexer 554. The latching/buffering circuits 552 for ports A and B sample the signal on the corresponding super bit lines SBL_A and SBL_B, respectively. The multiplexer 552 is connected to outputs of the latching/buffering circuits 552 and outputs either the port A signal or port B signal onto port B based on the equivalence signal 582, which is generated by comparing the two read addresses. If the two read addresses are not the same and are directed to different memory subblocks, the two read accesses will be served simultaneously from the two memory subblocks and the two memory words will be output onto the two output ports, respectively, (i.e., the multiplexer 554 selects the output on the super bit line SBL_B to the output port B). If the two read addresses are the same, one memory word will be read from the memory subblock, (which will be output on port A in this example), and the multiplexer 554 multiplexes the output on the super bit line SBL_A onto output port B. In this example embodiment, in the output network 550, the output out_a is driven from a static OR network involving two NAND gates followed by a NOR gates, while for out_b, the OR function is implemented with a single 4-input NAND gate. It should be understood that this is an example, and any other static logic network may be used here.

Figure 6:
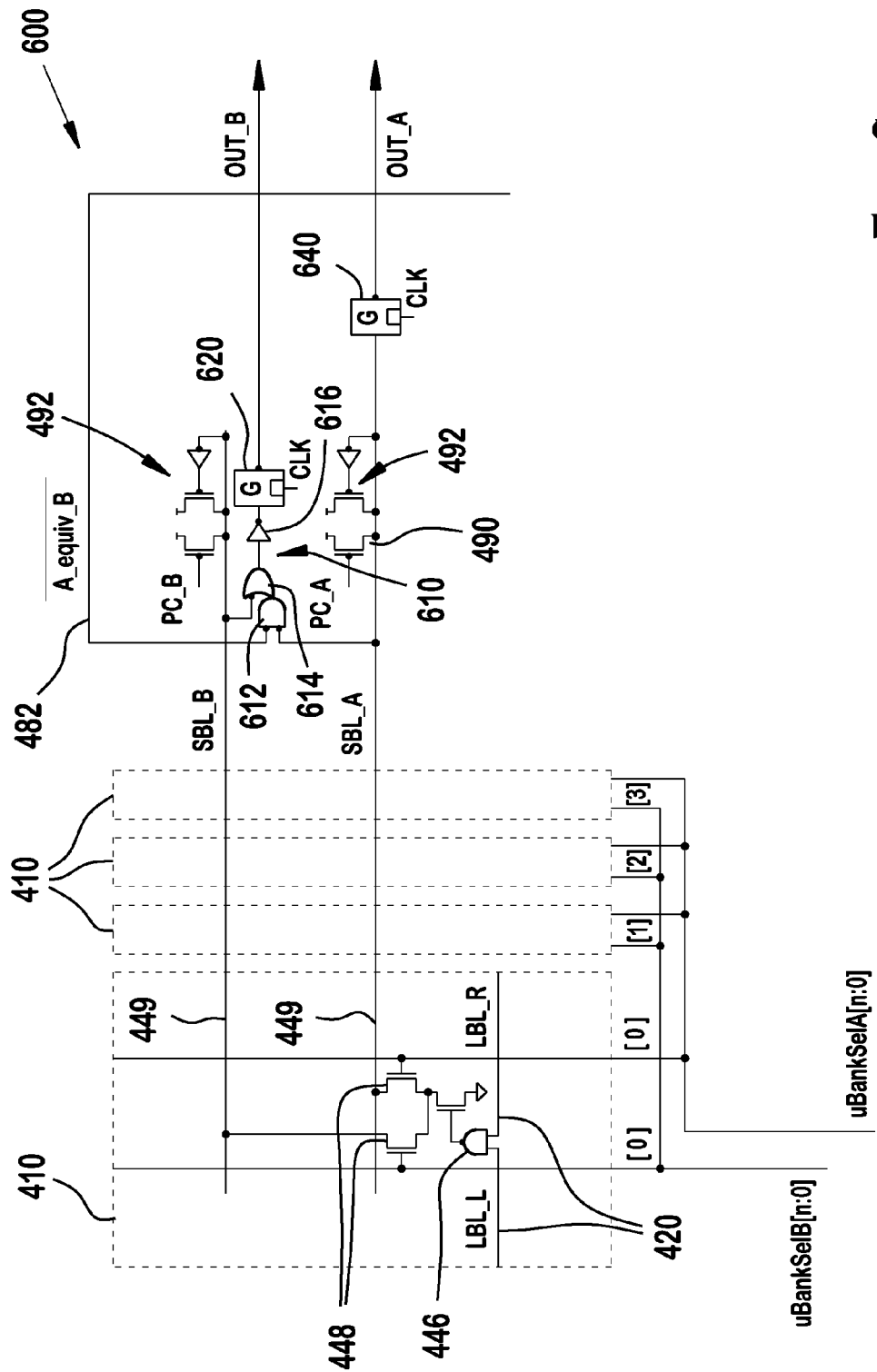
FIG. 6 shows memory arrays with an example integrated latching/multiplexing block in accordance with one embodiment.

The latching and multiplexing operations in the output network 450, 550 may be integrated. FIG. 6 shows memory arrays with an example output network 600 in accordance with one embodiment. It should be noted that the integrated output network in FIG. 6 may be used in any memory array in FIGS. 4 and 5. The information stored in a memory cell is transferred onto one of the local bit lines 420 (LBL_L or LBL_R), and onto one of the super bit lines 449 (SBL_A or SBL_B).

The output network 600 may include a complex gate 610, and latching circuits 620, 640, (e.g., glitch (G) latch). A pre-charging circuit 490 and a keeper circuit 492 are provided for pre-charging the super bit lines 449 (SBL_A and SBL_B). It should be noted that any other configuration for the keeper circuit and the pre-charging circuit may be employed other than the ones shown in FIG. 6.

The output network 600 samples the signal on the SBL_A and outputs it on port A. The output network 600 either samples the signal on SBL_B or signal on SBL_A depending on the equivalence signal ($\overline{A\_equiv\_B}$) 482 and outputs it on port B. The complex gate 610 passes a signal either on the SBL_A or SBL_B to the latching circuit 620 depending on the equivalence signal 482. If the equivalence signal 482 is high, (which means the two read addresses are different), the complex gate 610 passes the signal on the SBL_B to the latching circuit 620, and if the equivalence signal 482 is low, (which means the two read addresses are the same), the complex gate 610 passes the signal on the SBL_A to the latching circuit 620, (i.e., multiplexes the information on port A onto port B).

In the example in FIG. 6, the complex gate 610 comprises a negative AND gate 612 (both inputs to the AND gate being inverted), an OR gate 614 with one input being inverted, and an inverter 616. The inputs of the negative AND gate 612 are connected to the equivalence signal and the SBL_A. The non-inverted input of the OR gate 614 is connected to the output of the negative AND gate 612, and the inverted input of the OR gate is connected to the SBL_B. The output of the OR gate 614 is connected to the inverter 616. It should be noted that any other configuration of the complex gate 610 which is equivalent to the configuration shown in FIG. 6 may be employed.

If two read addresses are not the same and are directed to different memory subblocks (the equivalence signal 482 will be high), the information simultaneously read from two different memory subblocks will be shown on the super bit lines SBL_A and SBL_B, respectively. The information for output port A (on SBL_A) will be sampled by a latching circuit 640, (e.g., a G latch), and will be transferred onto the output port A. The information on SBL_B is also captured by the latching circuit 620 and will be transferred onto the output port B. Since the equivalence signal ($\overline{A\_equiv\_B}$) 482 is high, the output of the negative AND gate 612 goes low, and the OR gate 614 with one input being inverted will work as an inverter so that the signal on SBL_B will be captured by the latching circuit 620. The output from the latching circuits 620, 640 will keep the output after the super bit lines SBL_A and SBL_B go high by the pre-charging circuits 490.

If the two read addresses are the same, the memory will be read onto the super bit line SBL_A and the super bit line SBL_B will remain pre-charged. The output for output port A on SBL_A will be sampled by a latching circuit 640 and will be transferred onto the output port A. In this case, the equivalence signal ($\overline{A\_equiv\_B}$) 482 will go low, and the negative AND gate 612 will pass the signal on SBL_A, and the OR gate 614 with one input being inverted will also pass the output of the negative AND gate 612 since SBL_B will remain high (pre-charged). Therefore, the signal on SBL_A will also be sampled by the latching circuit 620, and will be transferred onto the output port B. If the signal on the super bit line SBL_A remains high, the output port B remains low and will not change.

Figure 7:
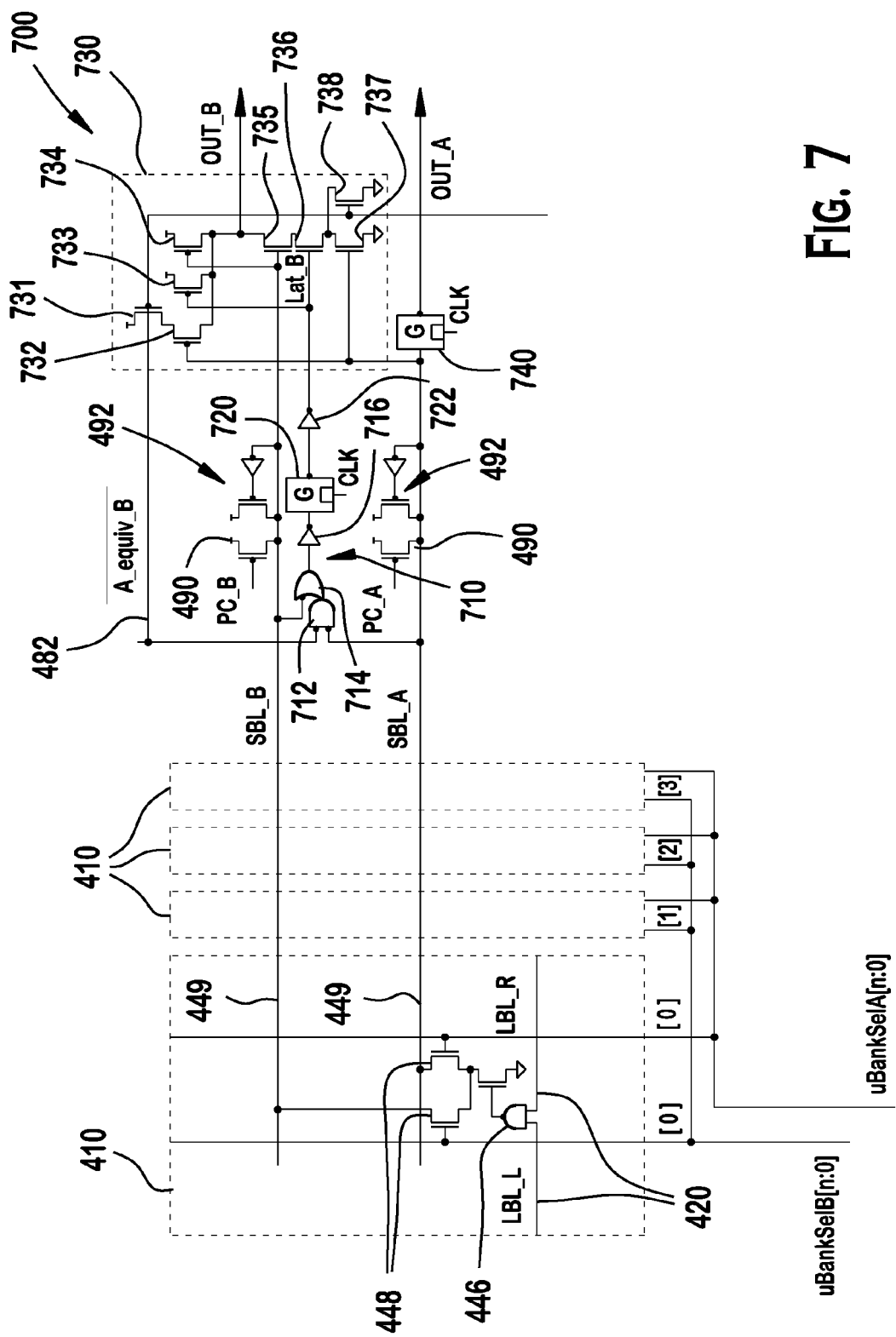
FIG. 7 shows memory arrays with an integrated latching/multiplexing block in accordance with another embodiment.

FIG. 7 shows memory arrays with an example output network 700 in accordance with another embodiment. In the embodiment in FIG. 6, the output on port B will be slower compared to the output on port A because of the extra gates on the output port B path. In accordance with this alternative embodiment in FIG. 7, such delay is avoided by adding a circuit 730 for a fastpath. It should be noted that the integrated output network in FIG. 7 may be used in any memory array in FIGS. 4 and 5.

The information stored in a memory cell is transferred onto one of the local bit lines 420 (LBL_L or LBL_R), and onto one of the super bit lines 449 (SBL_A or SBL_B). The output network 700 may include a complex gate 710, latching circuits 720, 740, (e.g., glitch (G) latch), an inverter 722, and an output circuit 730. A pre-charging circuit 490 and a keeper circuit 492 are provided for pre-charging the super bit lines 449 (SBL_A and SBL_B). It should be noted that any other configuration for the keeper circuit and the pre-charging circuit may be employed other than the ones shown in FIG. 7. The output circuit 730 includes a stack of p-type transistors 731, 732, 733, 734 and n-type transistors 735, 736, 737, 738 such that the output circuit 730 works as an inverter for inverting the signal on the super bit lines SBL_A or SBL_B depending on the equivalence signal 482.

The output network 700 samples the signal on the SBL_A and outputs it on port A. The output network 700 either samples the signal on SBL_B or signal on SBL_A depending on the equivalence signal ($\overline{A\_equiv\_B}$) 482 and outputs it on port B. The complex gate 710 passes a signal either on the SBL_A or SBL_B to the latching circuit 720 depending on the equivalence signal 482. If the equivalence signal 482 is high, (which means the two read addresses are different), the complex gate 710 passes the signal on the SBL_B to the latching circuit 720, and if the equivalence signal 482 is low, (which means the two read addresses are the same), the complex gate 710 passes the signal on the SBL_A to the latching circuit 720, (i.e., multiplexes the information on port A onto port B).

In the example of FIG. 7, the complex gate 710 comprises a negative AND gate 712 (both inputs to the AND gate being inverted), an OR gate 714 with one input being inverted, and an inverter 716. The inputs of the negative AND gate 712 are connected to the equivalence signal and the SBL_A. The non-inverted input of the OR gate 714 is connected to the output of the negative AND gate 712, and the inverted input of the OR gate is connected to the SBL_B. The output of the OR gate 714 is connected to the inverter 716. It should be noted that any other configuration of the complex gate 710 which is equivalent to the configuration shown in FIG. 7 may be employed.

If two read addresses are not the same and are directed to different memory subblocks (the equivalence signal 482 will be high), the information simultaneously read from two different memory subblocks will be shown on the super bit lines SBL_A and SBL_B, respectively. The information for output port A (on SBL_A) will be sampled by a latching circuit 740, (e.g., a G latch), and will be transferred onto the output port A. The super bit line SBL_B is connected to transistors 734 and 735 of the output circuit 730. Since the equivalence signal 482 goes high, the transistor 738 is turned on and the transistor 731 is turned off. In addition, the reset condition of latch 720 will cause the output of inverter 722 to be high (signal Lat_B). Therefore, the information for output port B (i.e., SBL_B) will be directly shown on the output port B through the output circuit 730. The signal on SBL_B is also captured by the latching circuit 720. Since the equivalence signal (A_equiv_B) 482 is high, the output of the negative AND gate 712 goes low, and the OR gate 714 with one inverted input will work as an inverter so that the signal on SBL_B will be captured by the latching circuit 720. The output from the latching circuit 720 will keep the output on port B after the super bit line SBL_B goes high by the pre-charging circuit 490.

If the two read addresses are the same, the memory will be read onto the super bit line SBL_A and the super bit line SBL_B will remain pre-charged. In this case, the equivalence signal (A_equiv_B) 482 will go low, and the negative AND gate 712 will pass the signal on SBL_A, and the OR gate with one inverted input 714 will also pass the output of the negative AND gate 712 since SBL_B will remain high (pre-charged). Therefore, the signal on SBL_A will be sampled by the latching circuit 720, and the output of the latching circuit 720 will go through the inverter 722 to the Lat_B signal. The super bit line SBL_A is connected to the transistors 732 and 737. Since the equivalence signal goes low, it will turn on the transistor 731 and turn off the transistor 738. If the signal on the super bit line SBL_A goes low, it will also turn the transistor 732 on and turn the transistor 737 off, and therefore, the transition from high to low on the super bit line SBL_A will be captured and output onto port B. This drives the output B high without any extra delay compared to output_A and the output of the latch 720 and the inverter 722 later maintains this state when SBL_A and SBL_B are pre-charged. If the signal on the super bit line SBL_A remains high, the output port B remains low and will not change.

Figure 8:
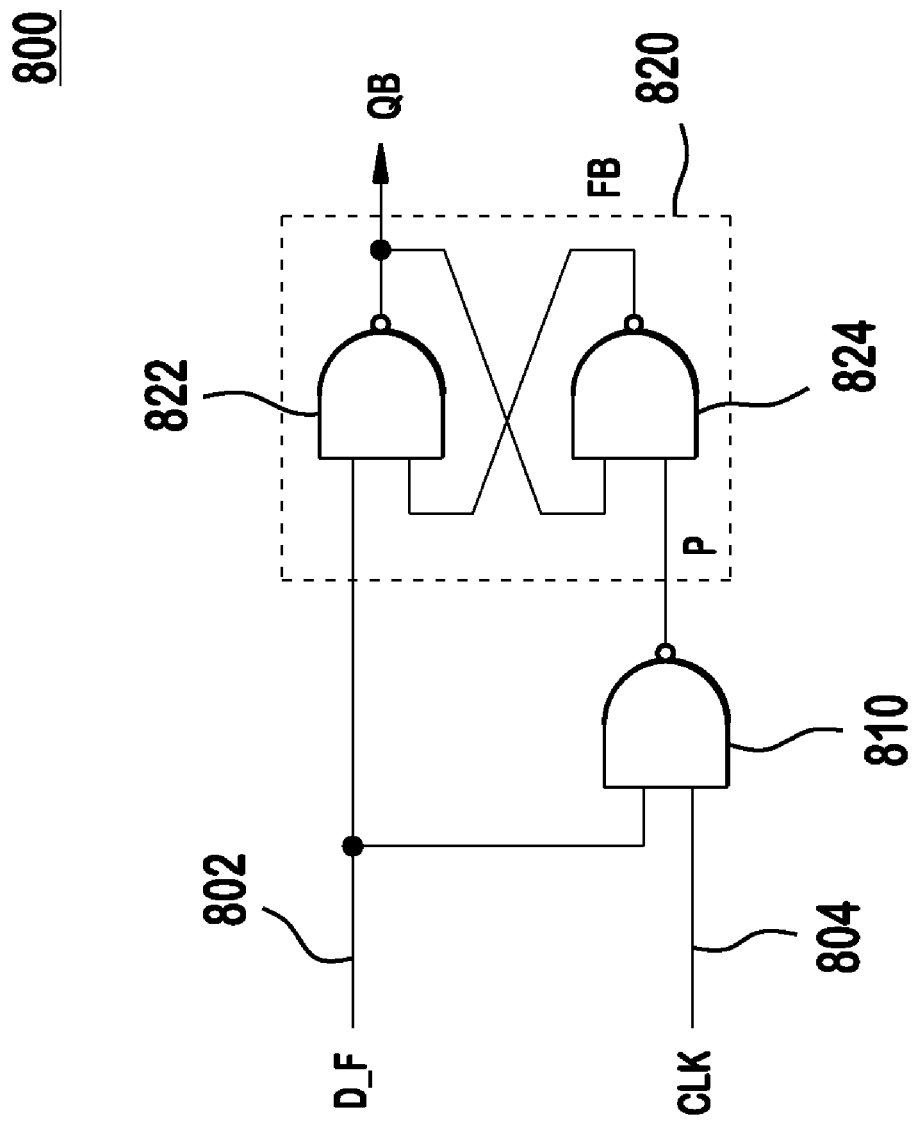
FIG. 8 shows an example glitch latch.

FIG. 8 shows an example glitch latch 800 that may be used as the latching circuit 620, 640, 720, 740 in FIGS. 6 and 7. The glitch latch 800 comprises a NAND gate 810 and a latch 820 comprising two cross-coupled NAND gates 822, 824. The input data 802, (i.e., super bit line), is connected to a first NAND gate 822 of the latch 820 and the NAND gate 810. A clock signal 804 is connected to the NAND gate 810. When the input data 802 is low, it sets the latch 820, (i.e., the output QB goes high). When the input data 802 is high (e.g., the super bit line is pre-charged), it resets the latch 820 while the clock signal 804 is high, and hold the current state while the clock signal 804 is low.

Although features and elements are described above in particular combinations, each feature or element may be used alone without the other features and elements or in various combinations with or without other features and elements. The apparatus described herein may be manufactured by using a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data (e.g., netlists, GDS data, or the like) that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

What is claimed is:

1. A multi-port memory array comprising:
   a plurality of memory sub-blocks, each memory sub-block comprising a plurality of single-read-port memory cells; and
   an output network configured to output information read from a memory sub-block in response to a plurality of memory read requests to a corresponding read port, and redirect information on a first read port to a second read port on a condition that an equivalence signal indicates that read addresses for the plurality of memory read requests are the same.

2. The memory array of claim 1 further comprising a comparator for comparing the read addresses and generating the equivalence signal based on comparison of the read addresses.

3. The memory array of claim 1 wherein the output network is an integrated latching/multiplexing network.

4. The memory array of claim 1 wherein the output network includes:
   a first latching circuit for the first read port;
   a second latching circuit for the second read port; and
   a multiplexing circuit for transferring a signal for the second read port to the second latching circuit on a condition that the equivalence signal indicates that the read addresses are different, and transferring a signal for the first read port to the second latching circuit on a condition that the equivalence signal indicates that the read addresses are the same.

5. The memory array of claim 4 wherein the first latching circuit and the second latching circuit are a glitch latch.

6. The memory array of claim 4 wherein the output network further comprises:
an output circuit for outputting the signal for the second read port to the second read port, bypassing the multiplexing circuit, on a condition that the read addresses are different.

7. The memory array of claim 4 wherein the output network further comprises:
an output circuit for outputting the signal for the first read port to the second read port, bypassing the multiplexing circuit, on a condition that the read addresses are the same.

8. The memory array of claim 1 wherein each memory sub-block includes an evaluate circuit comprising:
a NAND gate being connected a plurality of memory cells via local bit lines; and
gate transistors, each gate transistor being controlled by a corresponding memory sub-block select signal, respectively, such that a signal sampled by the NAND gate is transferred onto one of super bit lines based on the memory sub-block select signal.

9. The memory array of claim 1 wherein each memory sub-block includes an evaluate circuit comprising:
a first NAND gate being connected to a plurality of memory cells via local bit lines; and
a plurality of second NAND gates, each second NAND gate being connected to a corresponding memory sub-block select signal, respectively, and an output of the first NAND gate, such that a signal sampled by the first NAND gate is transferred onto one of super bit lines based on the memory sub-block select signal.

10. The memory array of claim 1 wherein the output network includes a multiplexer.

11. The memory array of claim 1 wherein the memory cells are 6-transistor memory cells.

12. The memory array of claim 1 wherein the memory cells are 8-transistor memory cells.

13. A method for reading a memory word from a multi-port memory array including a plurality of single-read-port memory cells, the method comprising:
receiving read addresses for memory read requests contemporaneously;
reading a memory word for a first read port from the memory array;
outputting the memory word on the first read port; and
redirecting the memory word on the first read port onto a second read port on a condition that the read addresses for the memory read requests are the same.

14. The memory of claim 13 wherein the memory cells are 6-transistor memory cells.

15. The memory of claim 13 wherein the memory cells are 8-transistor memory cells.

16. The memory of claim 13, further comprising:
determining an equivalence of the read addresses.

17. A non-transitory computer-readable storage medium storing a code for describing a structure and/or a behavior of a circuit configured to receive read addresses for memory read requests contemporaneously, read a memory word for a first read port from a memory array, output the memory word on the first read port, and redirect the memory word on the first read port onto a second read port on a condition that the read addresses for the memory read requests are the same.

18. The non-transitory computer-readable storage medium of claim 17 wherein the code is written in a hardware description language (HDL).

19. The non-transitory computer-readable storage medium of claim 17 wherein the circuit includes an output network comprising a first latching circuit for the first read port, a second latching circuit for the second read port, and a multiplexing circuit configured to transfer a signal for the second read port to the second latching circuit on a condition that the read addresses are different, and transfer a signal for the first read port to the second latching circuit on a condition that the read addresses are the same.

20. The non-transitory computer-readable storage medium of claim 19 wherein the circuit includes an output circuit configured to output the signal for the second read port to the second read port, bypassing the multiplexing circuit, on a condition that the read addresses are different.

* * * * *